(12) United States Patent
Horváth et al.

(10) Patent No.: US 10,569,248 B2
(45) Date of Patent: Feb. 25, 2020

(54) TITANIUM OXIDE AEROGEL COMPOSITES

(71) Applicant: ECOLE POLYTECHNIQUE FEDERALE DE LAUSANNE (EPFL), Lausanne (CH)

(72) Inventors: Endre Horváth, Lausanne (CH); László Forró, Ecublens (CH); Arnaud Magrez, Mieussy (FR)

(73) Assignee: Ecole Polytechnique Fédérale de Lausanne (EPFL), Lausanne (CH)

( * ) Notice: Subject to any disclaimer, the term of this patent is extended or adjusted under 35 U.S.C. 154(b) by 0 days.

(21) Appl. No.: 14/773,431

(22) PCT Filed: Mar. 6, 2014

(86) PCT No.: PCT/IB2014/059485
§ 371 (c)(1),
(2) Date: Sep. 8, 2015

(87) PCT Pub. No.: WO2014/136073
PCT Pub. Date: Sep. 12, 2014

(65) Prior Publication Data
US 2016/0030908 A1   Feb. 4, 2016

(30) Foreign Application Priority Data

Mar. 6, 2013 (WO) .................. PCT/IB2013/051788

(51) Int. Cl.
| | |
|---|---|
| *B01J 13/00* | (2006.01) |
| *H01M 4/485* | (2010.01) |
| *B01J 21/06* | (2006.01) |
| *B01J 35/00* | (2006.01) |
| *B01J 35/10* | (2006.01) |
| *C01G 23/04* | (2006.01) |
| *C09C 1/36* | (2006.01) |
| *C09K 5/14* | (2006.01) |
| *H01B 1/08* | (2006.01) |
| *H01G 9/20* | (2006.01) |

(Continued)

(52) U.S. Cl.
CPC ......... *B01J 13/0091* (2013.01); *B01J 21/063* (2013.01); *B01J 35/004* (2013.01); *B01J 35/10* (2013.01); *C01G 23/04* (2013.01); *C09C 1/3615* (2013.01); *C09K 5/14* (2013.01); *H01B 1/08* (2013.01); *H01G 9/2031* (2013.01); *H01G 11/46* (2013.01); *H01L 35/22* (2013.01); *H01M 4/485* (2013.01); *H01M 10/0525* (2013.01); *C01P 2006/12* (2013.01); *H01M 2004/021* (2013.01); *H01M 2004/023* (2013.01); *H01M 2004/027* (2013.01)

(58) Field of Classification Search
CPC ..... B01J 13/0091; B01J 35/10; C01G 23/047; H01B 1/08; C09K 5/14; H01M 4/48; H01M 10/0525; H01G 9/2031

USPC ................... 423/610; 516/98; 252/62, 520.2; 361/502; 429/231.5
See application file for complete search history.

(56) References Cited

U.S. PATENT DOCUMENTS 2,093,454 A * 9/1937 Kistler ................ B01J 13/0091
106/287.35
2,188,007 A * 1/1940 Kistler ................ B01J 13/0091
106/401

(Continued)

FOREIGN PATENT DOCUMENTS

| EP | 382310 | * 8/1990 |
| GB | 784392 | * 10/1957 |

(Continued)

OTHER PUBLICATIONS

Dagan et. al., "Preparation and characterization of TiO2 aerogels for use as photocatalysts" J. of Non-Crystalline Solids, 175 (1994) pp. 294-302.*

(Continued)

*Primary Examiner* — Steven J Bos
(74) *Attorney, Agent, or Firm* — Nixon & Vanderhye P.C.

(57) ABSTRACT

The invention relates to titanium oxide aerogels, in particular to titanium oxide binary or ternary (e.g. titanium oxide-carbon) aerogel monoliths possessing ordered meso- and macroporosity. The porous scaffold can be made with or without addition of binders and/or surfactants. The aerogel obtained by this method has a specific surface area greater than 60 m2/g and porosity larger than 60%. The surface area ranges from 60 to 300 m2/g. The porosity can reach as high as 99.6%. The size of the titanium oxide crystals are between 5 nm and 100 nm. The aerogel contains 100% titanium oxide. The composite (binary or ternary) aerogel can be prepared by adding at least 10% carbon in the form of (carbon nanotubes, carbon nanofibers, carbon microfibers, exfoliated graphene, cellulose fibers, polymer fibers, metallic and metal oxide nano and microfibers etc.). The aerogel can be prepared with a predeterminable shape. It can be shaped in a mold having a shape of a cylinder, cube, sheet or sphere. The aerogel can be also transformed into a supported or self-standing film with a thickness. The material can be used as a self-cleaning filter e.g. in a solar-thermal water and air purification system, in mesoscopic solar cells e.g. dye sensitized solar cells, multifunctional filler in polymer composites, in ceramics, in metals, thermoelectric material to convert (waste) heat into electricity, heat insulation material and electrode material in lithium ion batteries and supercapacitors.

18 Claims, 7 Drawing Sheets

Figure 1:
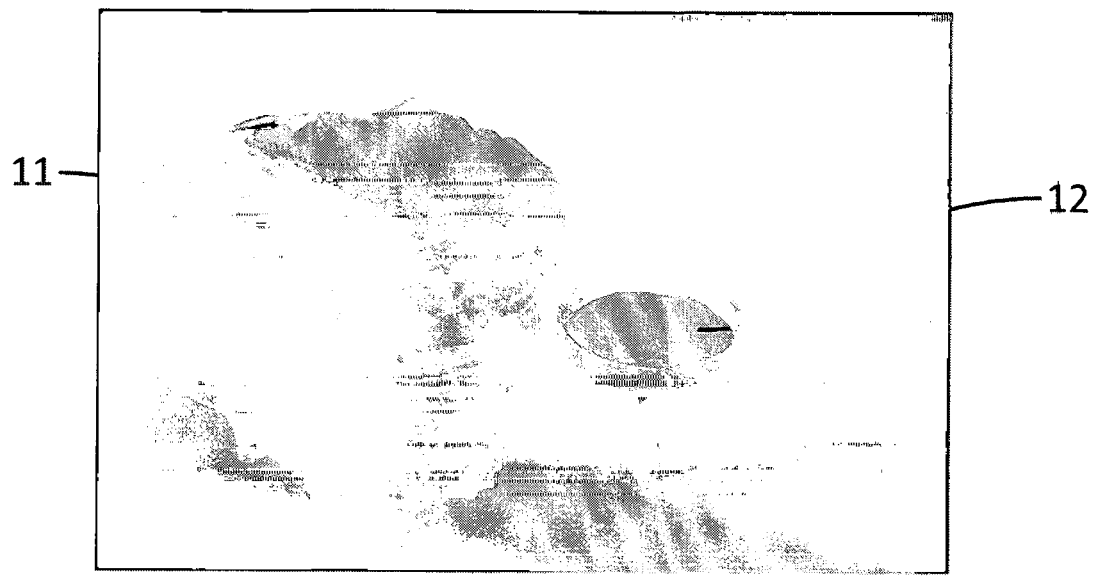

(51) Int. Cl.
  *H01G 11/46* (2013.01)
  *H01L 35/22* (2006.01)
  *H01M 10/0525* (2010.01)
  *H01M 4/02* (2006.01)

(56) References Cited

U.S. PATENT DOCUMENTS

| | | | | |
|---|---|---|---|---|
| 2,249,767 A * | 7/1941 | Kistler | B01J 13/0091 | 159/2.1 |
| 2,868,280 A | 1/1959 | Sargent et al. | | |
| 4,619,908 A * | 10/1986 | Cheng | B01J 13/0052 | 423/338 |
| 4,954,327 A | 9/1990 | Blount et al. | | |
| 5,395,805 A * | 3/1995 | Droege | B01J 13/0091 | 423/594.17 |
| 5,958,363 A * | 9/1999 | Coronado | B01J 13/0091 | 423/594.1 |
| 2003/0226443 A1* | 12/2003 | Rajagopalan | B01D 53/02 | 95/133 |
| 2004/0260139 A1* | 12/2004 | Klabunde | C10G 25/003 | 585/820 |
| 2006/0174933 A1 | 8/2006 | Rolison et al. | | |
| 2007/0119344 A1* | 5/2007 | Yeung | B01J 13/0091 | 106/287.34 |
| 2008/0206616 A1* | 8/2008 | Atanassova | C09D 11/30 | 429/479 |
| 2009/0012204 A1* | 1/2009 | Drechsler | C08B 11/15 | 523/105 |
| 2010/0187484 A1* | 7/2010 | Worsley | B82Y 30/00 | 252/510 |
| 2010/0190639 A1* | 7/2010 | Worsley | B01J 21/063 | 502/183 |
| 2012/0037838 A1 | 2/2012 | Bauer et al. | | |
| 2013/0202890 A1* | 8/2013 | Kong et al. | H01B 1/02 | 428/402 |

FOREIGN PATENT DOCUMENTS

| WO | 2006/075840 | * | 7/2006 |
|---|---|---|---|
| WO | WO 2011/001036 | | 1/2011 |

OTHER PUBLICATIONS

Abstract of US 2011-0129614 (Crowhurst et al.) Jun. 2, 2011.*
Dong, et al., "Multifuntional . . . 3D devices" J. Phys. Chem. B Letters, 2006, 110, 16819-22.*

Gesser et al, "Aerogels and related porous materials" Chem. Rev. 89, pp. 765-788. (Year: 1989).*
Pirard et al., "Interpretation of mercury porosimetry applied to aerogels," *Journal of Materials Research*, vol. 10, No. 08, Aug. 1, 1995, pp. 2114-2119.
Hamann et al., "Atomic Layer Deposition of TiO2 on Aerogel New Photoanodes for Dye-Sensitized Solar Cells", *Journal of Physical Chemistry Part C: Nanomaterials and Interfaces, American Chemical Society*, vol. 112, Jan. 1, 2008, pp. 10303-10307.
International Search Report for PCT/IB2014/059485, dated Jul. 28, 2014, four pages.
Written Opinion for PCT/IB2014/059485, dated Jul. 28, 2014, six pages.
Aleman et al., "Definitions of Terms Relating to the Structure and Processing of Sols, Gels, Networks, and Inorganic-Organic Hybrid Materials (IUPAC Recommendations 2007)," Pure and Applied Chemistry, 2007, vol. 79, No. 10, pp. 1801-1829.
Brodsky et al., "Effect of Drying Temperature on the Physical Properties of Titania Aerogels," J. Mater. Chem., 1994, vol. 4, No. 4, pp. 651-652.
Campbell et al., "Synthesis and Characterization of Titania Aerogels," Chem. Mater., 1992, vol. 4, No. 6, pp. 1329-1333.
Horvath et al., "Hydrothermal Conversion of Self-Assembled Titanate Nanotubes into Nanowires in a Revolving Autoclave," Chem. Mater., 2007, vol. 19, No. 4, pp. 927-931.
Jun. 1, 2018 Communication pursuant to Article 94(3) EPC issued in European Application No. 14 718 744.7.
Schneider et al., "High-surface-area Titania Aerogels: Preparation and Structural Properties," J. Mater. Chem., 1992, vol. 2, No. 6, pp. 587-589.
Stengl et al., "Titania aerogel prepared by low temperature supercritical drying," Microporous and Mesoporous Materials, 2006, vol. 91, pp. 1-6.
Teichner et al., "Inorganic Oxide Aerogels," Advances in Colloid and Interface Science, 1976, vol. 5, pp. 245-273.
Ward et al., "Synthesis and Structural Transformation of Zirconia Aerogels," J. Phys. Chem., 1993, vol. 5, No. 7, pp. 956-969.
Zhu et al., "Morphology of TiO2 Aerogels," Symposium N—Better Ceramics Through Chemistry VI, MRS Proceedings, vol. 346, 1994, pp. 751-756.
Zhu et al., "Morphology of TiO2 Aerogels. 1. Electron Microscopy," J. Phys. Chem., 1995, vol. 99, No. 43, pp. 15945-15949.
Zhu et al., "Morphology of TiO2 Aerogels. 2. Small-Angle Neutron Scattering," J. Phys. Chem., 1995, vol. 99, No. 43, pp. 15950-15954.

* cited by examiner

TITANIUM OXIDE AEROGEL COMPOSITES

This application is the U.S. national phase of International Application No. PCT/IB2014/059485 filed 6 Mar. 2014 which designated the U.S. and claims priority to International Application No. PCT/IB2013/051788 filed 6 Mar. 2013, the entire contents of each of which are hereby incorporated by reference.

FIELD OF INVENTION

The invention relates to titanium oxide aerogels, in particular to titanium oxide binary or ternary (e.g. titanium oxide-carbon) aerogel monoliths possessing ordered meso- and macroporosity.

PRIOR ART

Aerogels are unique among solid materials. They have interesting physical and chemical properties e.g. very low skeletal densities (up to 95% of their volume is air), large open porosity, high optical transparency and high specific surface area associated with extremely low sound velocity and thermal conductivity. Formation of the highly porous three-dimensional network in particular the kind of precursors and the reaction conditions are the key steps in the preparation of aerogels. The resulted micro, meso- and macroporosity is highly influenced by the physico-chemical processing used during the preparation. In the beginning sponge-like solid network is filled with liquid. In most of the cases special drying techniques must be applied to exchange the pore liquid with air while maintaining the filigrane solid network. Basically all metal or semimetal oxides are known to form gels, and many applied for the fabrication of aerogels.

The first $TiO_2$ aerogels were prepared by Teichner et al. in 1976.[1] Until today, titanium-propoxide, -butoxide and -sulfate are primarily used as precursors.[2-6] $TiO_2$ aerogels can be prepared completely amorphous or with a network of crystalline anatase primary particles.[7-9] The porosity of the reported $TiO_2$ aerogels is typically 78-90%.[10] The preparation of aerogels with porosity above 90% is a real technological challenge.

[1] S. J. Teichner, G. A. Nicolaon, M. A. Vicarini, G. E. E. Gardes, *Adv. Colloid Interface Sci.* 1976, 5, 245

[2] C. J. Brodsky, E. I. Ko, *J. Mater. Chem.* 1994, 4, 651

[3] L. K. Campbell, B. K. Na, E. I. Ko, *Chem. Mater.* 1992, 4, 1329

[4] D. A. Ward, E. I. Ko, *J. Phys. Chem.* 1993, 5, 956

[5] M. Schneider, A. Baiker, *J. Mater. Chem.* 1992, 2, 587

[6] V Štengl, S. Bakardjieva, J. Sůbrt, L. Szatmary *Microporous and Mesoporous Materials* 2006, 91, 1-6

[7] Z. Zhu, M. Tomkiewicz in *Better Ceramics Through Chemistry V: Mater. Res. Soc. Symp.* 1994, 346 p. 751

[8] Z. Zhu, Y. Tsung, M. Tomkiewicz, *J. Phys. Chem.* 1995, 99, 15945

[9] Z. Zhu, M. Lin, G. Dagan, M. Tomkiewicz, *The Journal of Physical Chemistry* 1995, 99, 15 950

[10] G. Dagan, M. Tomkiewicz, *J. Non-Cryst. Solids* 1994, 175, 294.

According to our knowledge such a porous aerogels from pure titanium oxide have not been realized yet. The closest article to our invention is that of published by Tian and co-workers in 2006. In their work paper-like free-standing films (FSM) and FSM-based 3D macroscopic devices made purely from long inorganic functional titanium oxide nanowires have been introduced. Their method consists of hydrothermal treatment of $TiO_2$ powders with a volume of an alkali solution in a sealed container. Their nanowire membrane device was not transparent, weighted about 0.2-0.3 g with nearly 500 microns wall thickness. The porosity of their FSM has not been reported. Based on their data our estimation gives around 60% porosity. The procedure of making those FSM films required a heating temperature greater than 160° C.[11] However, Horváth et al reported formation of titanate nanowires in a rotating sealed autoclave at much lower temperature 130° C. where the pressurized cylindrical vessel was rotated at 60 rpm around its short axis.[12] The apparatus contained an internal mixing element.

[11] W. Dong, A. Cogbill, T. Zhang, S Gosh, Z. R. Tian *J. Phys. Chem. B* 2006, 110, 16819-16822

[12] E. Horvath, A. Kukovecz, Z. Konya, I. Kiricsi, *Chem. Mater.* 2007, 19, 927-931

The above mentioned solutions have several disadvantages. Those are due in particular to the fact that they use a pressurized vessel, a temperature as high as 130° C. In addition, prior art solutions induce scaling up problems; i.e. the preparation is less effective when increasing the vessel volume greater than 2 liters.

GENERAL DESCRIPTION OF THE INVENTION

The primary object of the present invention is to provide a titanium oxide aerogel or a titanium oxide based binary or ternary (e.g. titanium oxide-carbon) aerogel monolith possessing extremely high porosity.

The invention therefore relates to products, processes, methods and uses as defined in the claims.

The viscosity of the aerogel before the drying process is preferably 80-100 Pa/s. The aerogel advantageously has a specific surface area greater than 60 $m^2/g$ and porosity larger than 60%. Preferably the surface area ranges from 60 to 300 $m^2/g$. The obtained porosity can be very high, typically up to 99.6%. The aerogel has an extremely open and continuous pore structure preferably containing at least 10% of slit shaped mesopores (2-100 nm). The macroporosity (pore diameter larger than 100 nm) can reach 90%. No unconnected porosity is present in the gel. The porosity can be controlled between 1-99.6% by compressing the monolith with a press, rollers etc. (FIGS. 2-3) The aerogel can be irreversibly compressed up to 99.6% to its volume. The size of the titanium oxide crystallites in the gel are between 5 nm and 100 nm. The crystallites assemble into elongated particles of several micrometers in length. The aerogel composed of 100% titanium oxide and shows a white color. The resistivity of the aerogel is higher than $10^{13}$ Ohm*cm. The resistivity of the aerogel can be lowered to 206 Ohm*cm by a thermal treatment at no less than 600° C. under $H_2$ atmosphere. Depending on the temperature and the duration of the treatment the aerogel shows from light blue to black color. Thermal conductivity of the aerogel is 0.033 W/mK.

Figure 7:
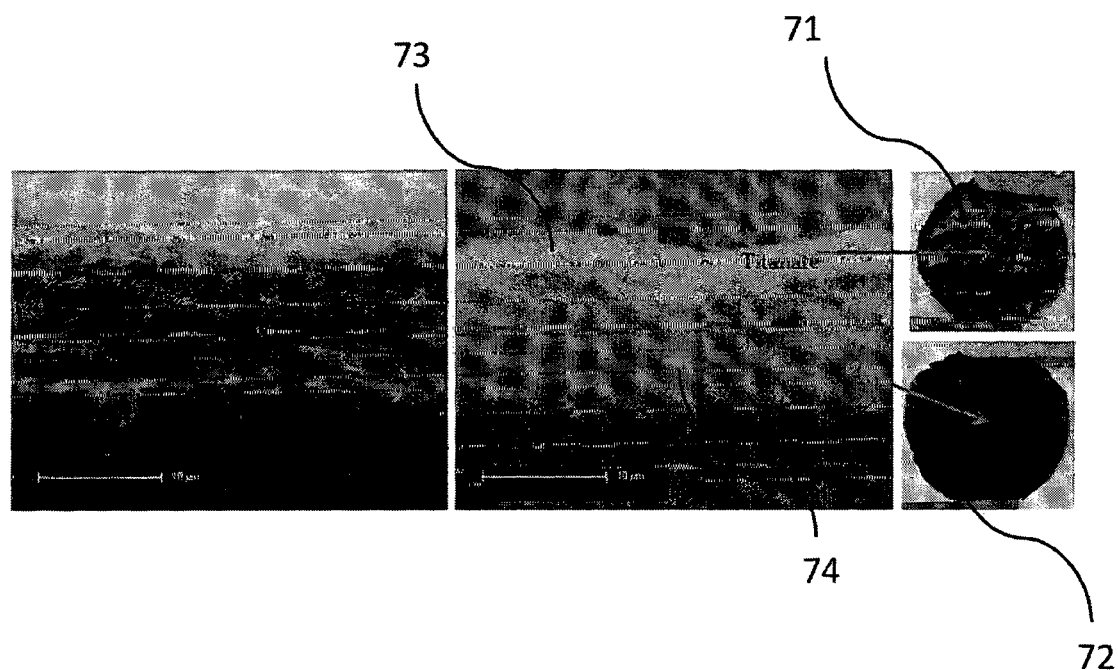

The composite (binary or ternary) aerogel contains at least 1% carbon in the form of (carbon nanotubes, carbon nanofibers, carbon microfibers, exfoliated graphene, natural fibers e.g. cellulose fibers, polymer fibers, metallic and metal oxide nano and microfibers etc.) and at least 1% of metal or metal oxide nanoparticles (Ag, Au, $ZrO_2$, $VO_2$, $MnO_2$ etc.). Alternatively, the porous scaffold contains at least 1% binders and/or surfactants. The resistivity of the carbon nanotube titanium oxide aerogel decreases by ten orders of magnitude (from $10^{13}$ to $10^3$ Ohm*cm) between 0 and 10 w % carbon nanotube content. The titanium oxide aerogel adsorbs the hydrophilic compounds, however the composite aerogel adsorbs both the hydrophilic and hydrophobic hazardous compounds (molecules, germs). Exposing the aerogel or composite aerogel to UV or visible light different reactive oxygen species (ROS) form. The composite aerogel is twice as active as the highly optimized commercial Degussa P25 in methyl orange photo-decomposition (FIG. 7). Using the VIS and UV sources, the *E. coli* inactivation rate is significantly higher on the surface of the nanocomposite aerogel as compared to the control (Teflon) surface (see FIG. 8). The visible and infrared light heats up the aerogel composite. From a flux of a liquid or gas dispersed particles bigger than 10 nm will not be able to enter in the composite aerogel. The aerogel can have a predeterminable shape. It can be shaped in a mold having a shape of a cylinder, cube, sheet or sphere. The aerogel can be also transformed into a supported or self-standing film with a thickness. When a surface structured tool is used to apply the pressure, micron and nano sized features (replica of the pressing tool) are created on the surface of the aerogel. Such replicas possess special optical properties permitting applications as a colorful optical grating (FIG. 3 (31, 34)), a Bragg reflector or an antireflective coating. The surface patterning of the aerogel dramatically affects its wetting properties, enabling therefore the making of water repellent (superhydrophobic FIG. 3(34)) or superhydrophilic surfaces (FIG. 3(33)).

Another object of the present invention is to provide a cheap, simple and easily scalable to m$^3$ volume method and device for producing titanium oxide based binary, ternary aerogels with extremely high (above 90%) porosity. The device comprises of a heatable base resistive vessel (PTFE, PP, PA etc. or metallic vessel with internal polymer coating) having a heat insulation layer around the vessel. The mixing paddle or paddles with brush-like end enter into the reaction vessel through a jacketed condenser from base resistive material attached to the vessel cover. The external mixer allows safe and turbulent mixing of the highly basic mixture with 300-2500 rpm (high shear mixing) at atmospheric pressure. The device is able to operate from room temperature up to 250° C. With this device titanium oxide composite aerogels can be produced at as low as 80° C.

Another object of the present invention is the use of the titanium oxide aerogels and titanium oxide binary or ternary (e.g. titanium oxide-carbon) aerogel monoliths possessing ordered meso- and macroporosity. The material can be used as a self-cleaning filter e.g. in a solar-thermal water and air purification system, in mesoscopic solar cells e.g. dye sensitized solar cells and perovskite based meso-superstructured solar cells, multifuctional filler in ceramics, metal and polymer composites, thermoelectric material to convert (waste) heat into electricity, heat insulation material and electrode material in lithium ion batteries and supercapacitors.

Preferred Embodiment: Process for Fabricating Titanium Oxide Composites Comprising the Following Steps (a) placing a titanium containing compound with at least 10% Ti content (in the case of binary, ternary aerogel addition of the second and third compound) into a base resistive vessel (PTFE, PP, PA etc. or metallic vessel with internal polymer coating) having a heat insulation layer around the vessel (b) titanium containing compound is heat-treated at 350-900° C. in (air, $O_2$, $H_2$, Ar, $N_2$ or a mixture of these) Where the titanium containing compound stands for:
 $TiO_2$ (anatase, rutile, brookite, $TiO_2$ (B), $TiO_2$ (H), and $TiO_2$ (R))
 Ilmenite ($FeTiO_3$)
 Metallic Titanium
 Protonated titanates (orthotitanates, metatitanatres e. g. $H_2Ti_3O_7$)
 Non-stoichiometric $TiO_{2-x}$
 Amorphous $H_2Ti_3O_7$
 Natural rutile sand
 with a particle size ranging from 1 nm to 10 cm with spherical, tubular or needle-like particle shape (c) If the particle size is larger than 1 mm, grinding is required (d) When making the (binary or ternary aerogel) e.g. titanium oxide-carbon aerogel monolith the titanium containing starting material includes from 0.1 to 30% by volume of fibers (carbon nanotubes, carbon nanofibers, carbon microfibers, exfoliated graphene, cellulose fibers, metal or metal oxide nano and microfibers etc.)

(e) adding base solution (NaOH, KOH, CsOH, RbOH, $NH_4OH$, NaCl, KCl or their mixture) with a concentration of 1-20 M (f) the mass ratio of the Ti containing starting material and the base solution is 1/5-80

(g) heating the mixture at least to 70° C. (70-250° C.) at atmospheric pressure (h) turbulent mixing the mixture with an external mixer with brush-like end with 300-2500 rpm (high shear mixing). The mixing paddle or paddles enter into the reaction vessel through a jacketed condenser from base resistive material attached to the vessel cover (i) the solid particles are moving in the reaction media with a speed of 1-130 m/s (j) the porosity and pore size distribution of the gel can be controlled by the rotation speed and temperature (swirling flow enhanced mixing)

(k) Temperature of 70° C. favours the formation of the gel with higher fraction of mesopores and lower fraction of macropores (l) Temperature above 100° C. favours formation of the gel with lower fraction of mesopores and higher fraction of macropores (m) Rpm 1-250 favours the formation of the gel with higher fraction of mesopores and lower fraction of macropores (n) Rpm 250-2500 favours formation of the gel with lower fraction of mesopores and higher fraction of macropores (o) The synthesis time is 1-24 hours (p) The textural properties can be more precisely controlled by including ramps in the temperature, time and turbulent mixing (rpm)

(q) Throughout the gel formation the viscosity increases from 0.3 mPa/s to 100 Pa/s (r) The volumetric expansion of the titanium containing compound is 80-150 (FIG. 1)

(s) Transferring the titanium oxide composite gel into a press or centrifuge built from (or covered with) a base resistive material (PTFE, PA, HDPE, PP etc.)

(t) compression, centrifugation of the gel in order to recycle the base solution (the base solution can be reused for the next synthesis guaranteeing an economic, environment friendly and sustainable process)

(u) transferring the gel into an acidic solution (independently selected from the group consisting HCl, $HNO_3$, $H_2SO_4$, HCOOH, citric acid etc.) Reaching pH=1-7

Figure 2:
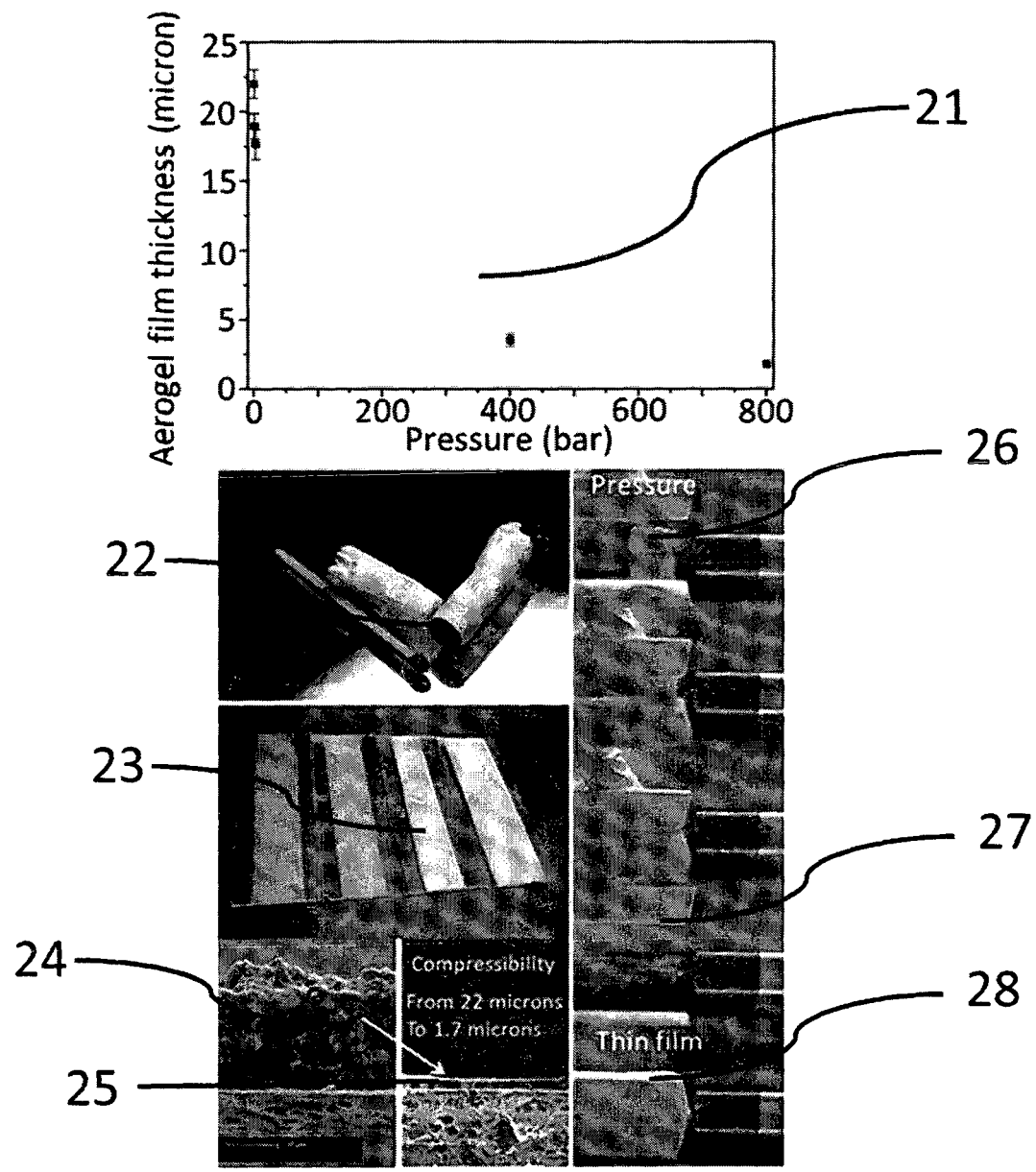
Figure 3:
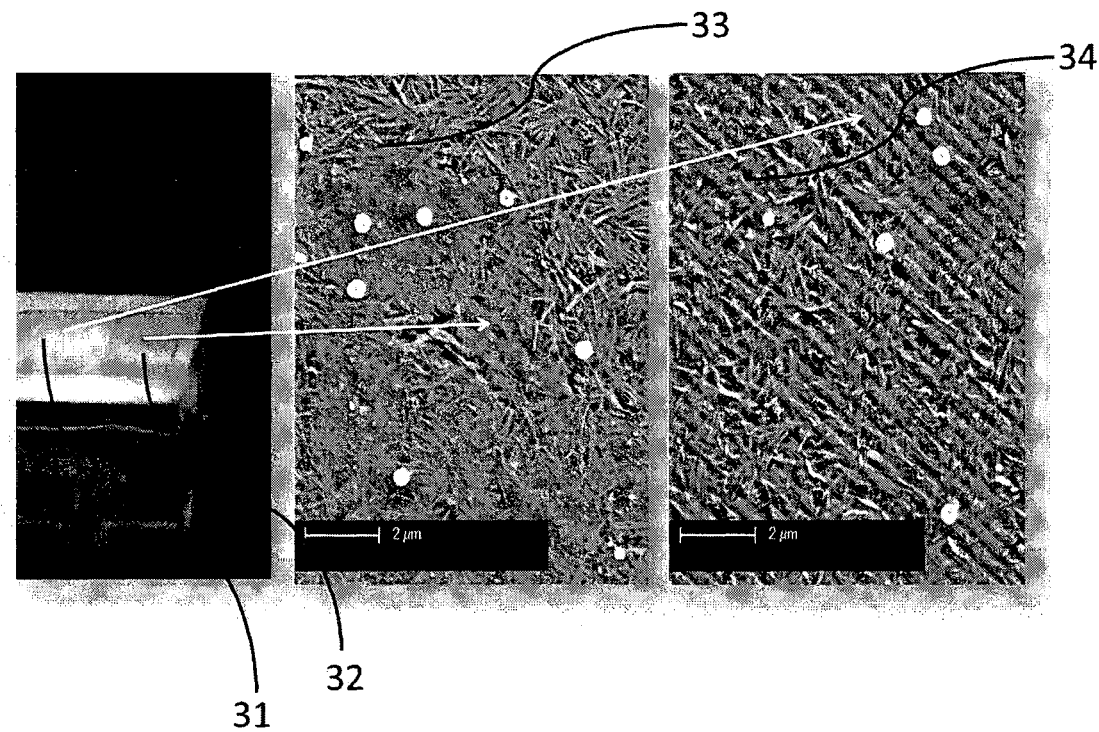

(v) compression, centrifugation the gel in order to separate from the liquid (w) repeating the process for 1-5 times (x) transferring the gel into a. deionized water
b. or alkali metals, alkaline earth metals, inner transition metal, transition metal, post-transition metal containing liquid (Au, Ag, Ni, Fe etc.)
c. or saturated salt solution of alkali metals, alkaline earth metals, inner transition metal, transition metal, post-transition metal; Orthotitanates ($M_2TiO_4$, where M is divalent ion) or metatitanates ($MTiO_3$, where again M is divalent) aerogels can be synthesized by the subsequent heat treatment (150-1000° C.) of the aerogel embedded into the M salt (y) The gel can be shaped in a mold having a shape of a cylinder, cube, sheet, sphere or supported film or mesh with a thickness (FIG. 2)

(z) The supported film can be prepared by doctor blading, screen printing, filtering, dip coating, spin coating with a thickness less than 2 micron; as a result highly transparent aerogel films can be prepared with a transmittance of 3-80%

(aa) The supported film can be removed from the support when the support is a hydrophobic material (PTFE, PA, FTO, ITO etc.)
As a result free-standing, flexible and highly transparent titanium oxide films can be fabricated (bb) drying:
a. supercritical,
b. liophylization,
c. drying at in air 120° C.

(cc) calcination at 400-1000° C. under ($O_2$, $N_2$, Ar, $H_2$, carbon containing gas as acetylene, ethylene, methane or their mixtures) gas atmosphere (dd) optionally, subjecting the dried monolith to green machining (ee) the aerogel monolith has the porosity 60-99.6%

(ff) alternatively, the porosity (hence the optical and electronic properties) can be controlled between 1-99.6% by compressing the monolith with a press, rollers etc. (FIG. 2)

The transport- and density-dependent properties of the composite aerogel can be tuned by varying the volume fraction of the reactants, thereby increasing the design flexibility of these micro, meso- and macroporous materials for optical, chemical, thermal, magnetic, and electronic applications. The chemical and physical properties of the composite material can be further engineered at multiple points during the processing by modifying porosity, pore size and pore orientation distribution, flexibility and transparency of host solid composite gel, or the composite aerogel.

Example: Manufacturing Process for Titanium Oxide Aerogel Composites and Their Use for the Inactivation of Harmful Chemical and Biological Agents: with Focus on Solar-Thermal Water and Air Purification The efficient utilization of the energy of visible light (solar energy) is one of the most pressing task for mankind and researchers. Engineered pore structured micro and mesoporous materials (e.g. aerogels) discovered during the last two decades can open up several novel applications in harnessing solar energy, due to their unique characteristics. The present invention can be applied in the field of biological, chemical and particulate filters; more specifically, in the field of photo-catalytic biological, chemical and particulate filters.

As is has been reported humans, on average, spend 85% of their lives indoors. However, indoor air could be contaminated with volatile organic compounds, tobacco smoke, offensive odors, viruses and bacteria, or other hazardous materials that adversely affect on the human health. Therefore, the demand for indoor air purification is increasing.

In parallel, an estimated 884 million people lack access to safe drinking water and a total of more than 2.6 billion people lack of basic sanitation. Studies also pointed out that about 1.5 million children under the age of five die each year and 443 million school days are lost because of water- and sanitation-related diseases. In 2010 UN General Assembly declared that the access to clean water and sanitation is a human right.

Accordingly, research to develop sustainable water and air purification systems has been increasing. Most of the cheap ordinary water and air filters suffer from membrane fouling. Membrane fouling can cause severe flux decline and affect the quality of the liquid or air produced. Severe fouling may require intense chemical cleaning or membrane replacement. This increases the operating costs. There are various types of foulants: colloidal (clays, flocs), biological (bacteria, fungi), organic (oils, polyelectrolytes, humics) and scaling (mineral precipitates). Microbes retained inside the filter could multiply using particulates adhered to the filter as food source transforming the filter into a source of pathogens. As a result development of filters having anti-microbial properties, to prevent the filter from becoming a breeding ground for allergens, is required. It is also valid for most of the conventional filters that they are not capable of trapping nanosized (particles smaller than 0.3 micrometer) from the liquid or air that passes through. Unfortunately, these ultrafine particles are the most harmful to our health.

Figure 4:
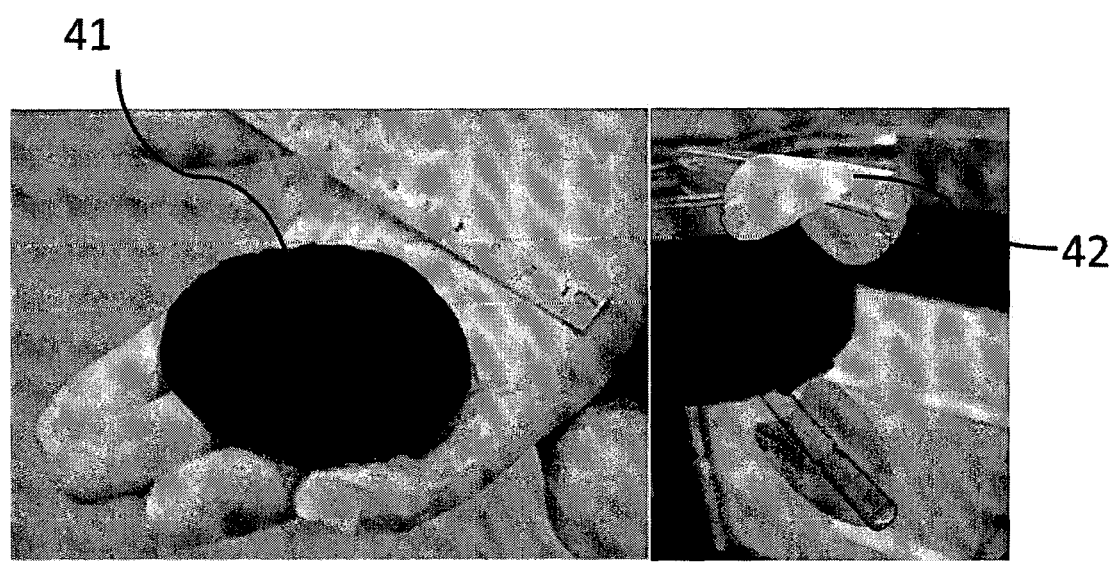

The present invention provide a device based on a filter that couple the classical filtration separation technology with light induced self-cleaning abilities: increasing its catalytic activity and reducing the potential membrane fouling. First, the waterborne and airborne pathological compounds (viruses and bacteria), as well as other organic compounds were separated from the environment (liquid or gas, see FIG. 9(91)). Second, by exposing the photoactive material to UV or visible light, the different reactive oxygen species (ROS) formed kill or inactivate the hazardous biological or chemical compounds (see FIG. 8(83), FIG. 9(92)). Third, the incoming photons heat up the black colored system resulting in a sterilization (pasteurization) effect against biological hazard (FIG. 4(41)). These three functions coupled in one device ensure superior filtration efficiency powered by the energy of photons coming from the sun or from an artificial light source.

The present proposal deals with the medium and large scale fabrication of special self-standing titanium oxide aerogel membranes and their binary, ternary composites with ultralong carbon nanotubes/carbon nanowires carbon nanotubes, carbon nanofibers, carbon microfibers, exfoliated graphene, natural fibers as cellulose fibers, polymer fibers etc. (FIG. 4(41,42)). In order to achieve superior (photo) catalytic activity, there is the possibility to tailor the inorganic part by doping with metal ions or decorating with different metal or metal oxide nanoparticles Ag, Au, Cu, $Fe_2O_3$, $ZrO_2$, $VO_2$, $MnO_2$ etc. (FIG. 6(61,62,65), FIG. 8(81,82)).

Since the discovery of photocatalytic water splitting in the 70s, several semiconductor nanoparticles were found to have remarkable photoactivity. However for a real functional device, the safety and economic requirements necessitated to immobilize these nanoparticles onto a substrate which turned out to be a real challenge for the material scientists. Our aerogel represent an innovative solution to eliminate all the problems around the particle immobilization process.

The nanocomposite membranes developed from the titanium oxide aerogel disclosed above couple the classical filtration separation technology with self-cleaning abilities: increasing its catalytic activity and reducing the potential membrane fouling.

Figure 5:
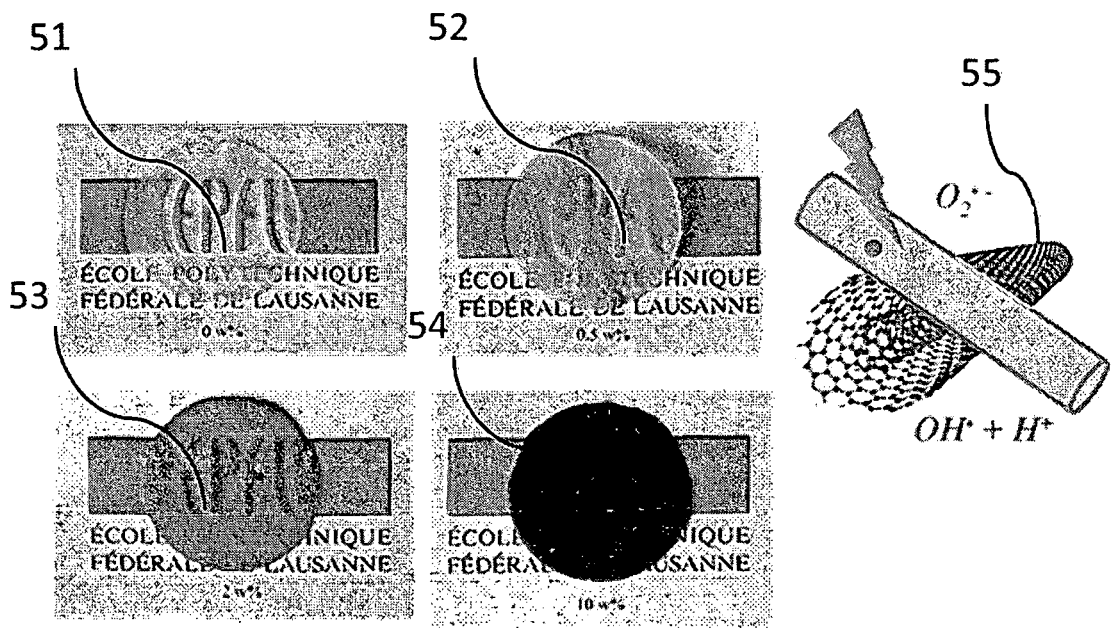

The carbon nanotube content determines the adsorption, as well as the optical, electrical and mechanical properties (see FIG. 5).

The fabrication process allows us to prepare two main membrane architectures. On the one hand we are producing membranes where the two main constituents carbon nanotubes and the titanium oxide aerogel were homogeneously mixed together forming an interpenetrating secondary structure (FIG. 6(64)). On the other hand, preparation of laminated configuration results in a membrane with alternating layers of the two main constituents (see FIG. 7(73,74)).

Figure 8:
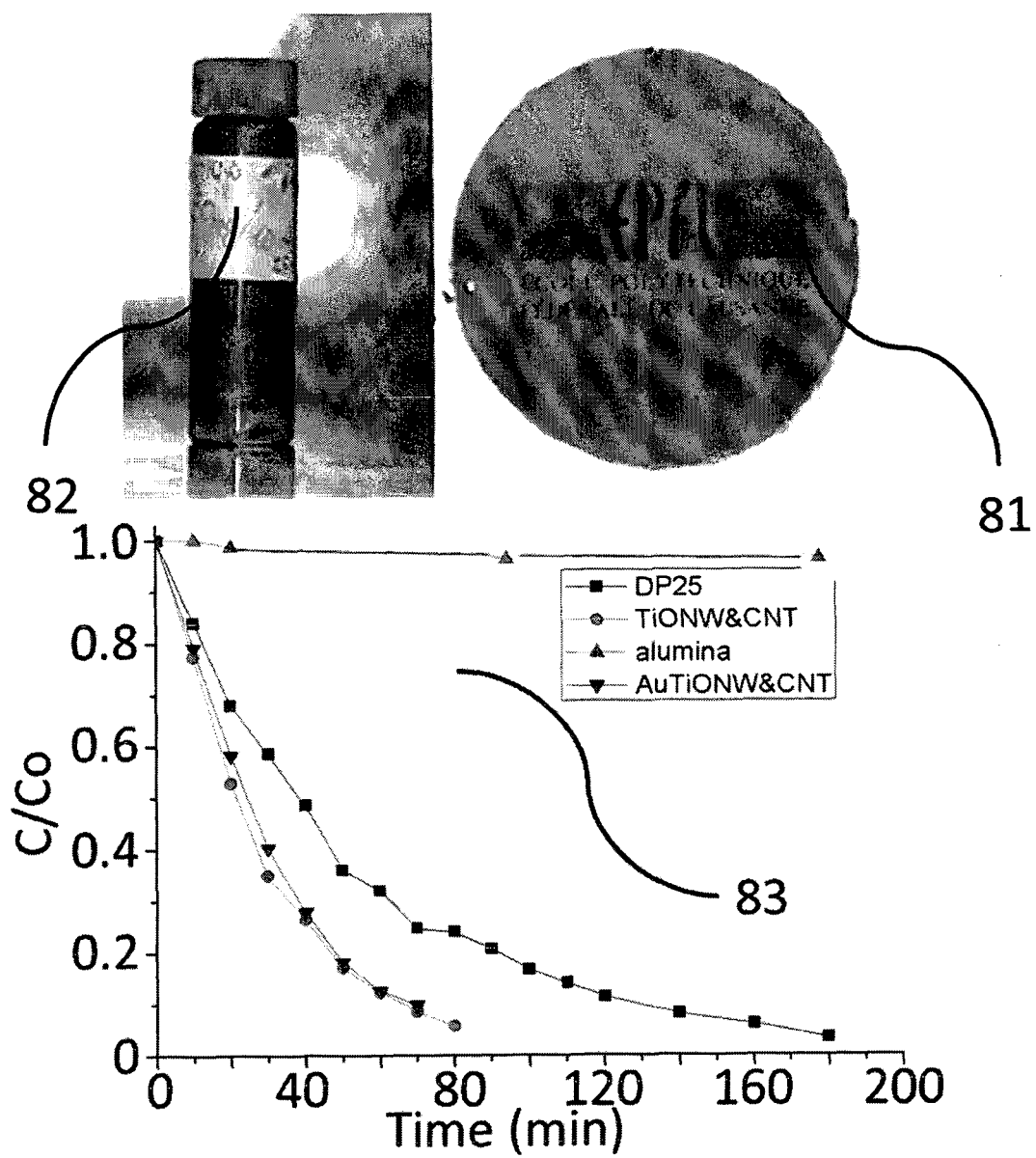
Figure 9:
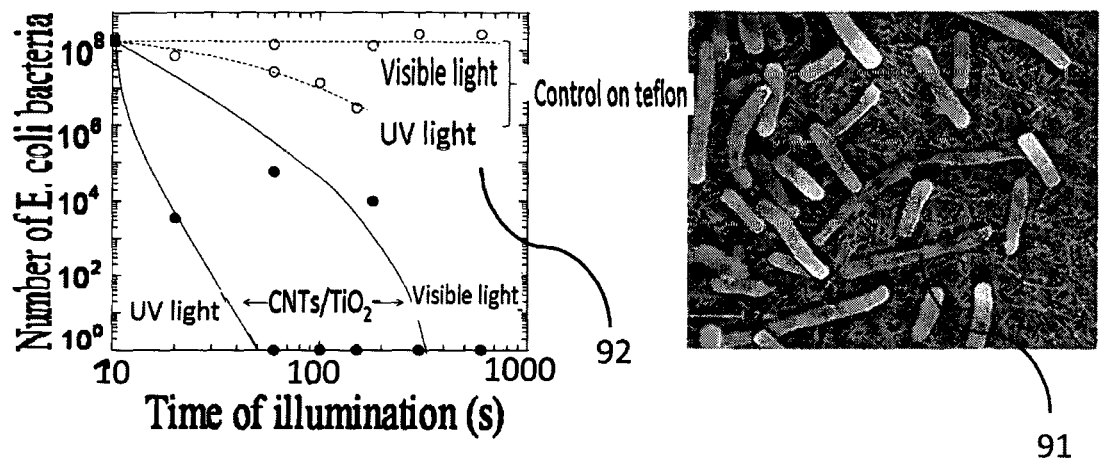

The aerogel films in methyl orange decomposition are twice as active as the highly optimized commercial Degussa P25 (FIG. 8(83)).

*Escherichia coli* bacteria deactivation rate was determined in a flow reactor on UV and VIS irradiated nanocomposite filters. The control experiment in the dark showed no toxicity. In both cases, using the VIS and UV sources, the *E. coli* inactivation rate was significantly higher on the surface of the nanocomposite aerogel membrane as compared to the control (Teflon) surface (see FIG. 9(92)).

The role of CNTs in the aerogel membrane:
High surface area to adsorb hydrophobic compounds
Increase the catalytic activity by electron abstraction
Mechanical integrity
Electrical conductivity
The role of titanium oxide aerogel in the membrane:
High surface area to adsorb hydrophilic compounds
Photo-catalytic and catalytic activity, ROS production
Support to decorate it with noble metals or oxide nanoparticles (FIG. 6(61,62,65))

The combination of these two materials in one aerogel membrane, results in a material which adsorbs both the hydrophilic and hydrophobic hazardous compounds.

Figure 6:
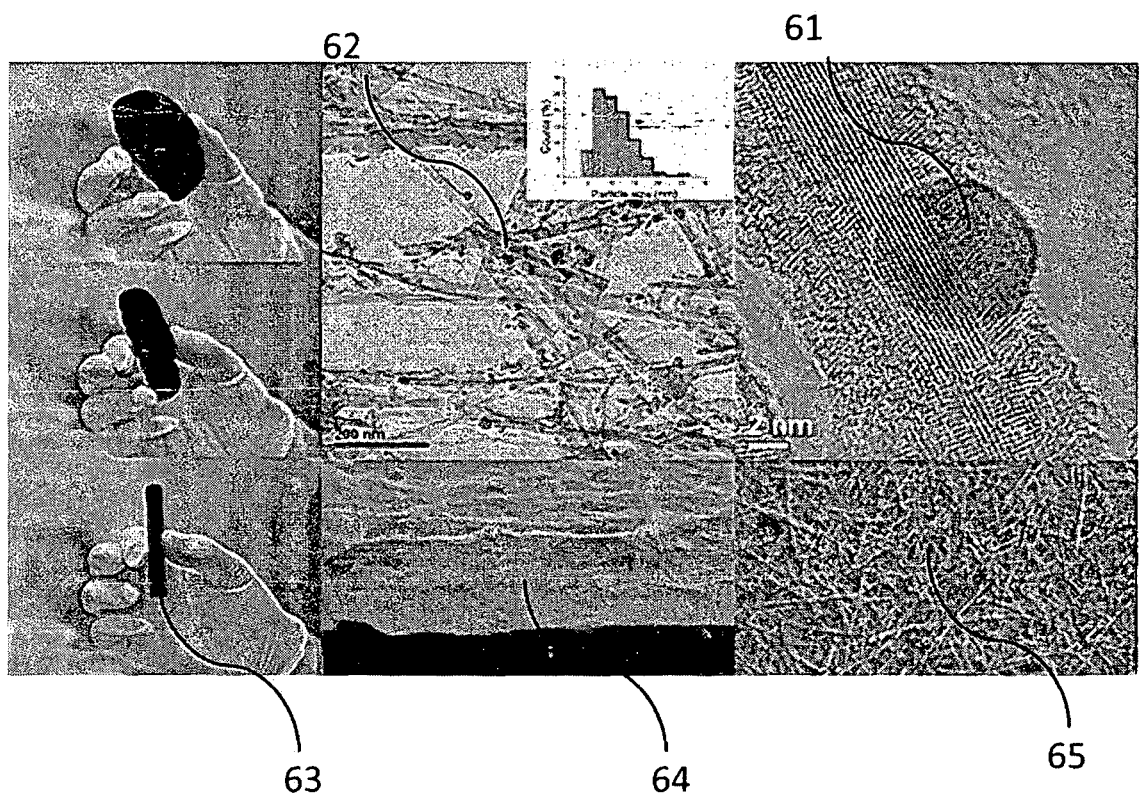

The thickness of the membrane is in the couple of microns or eventually in the submicron regime (see FIG. 6(64), FIG. 7). This allows high optical transmittance and low pressure difference operation. This new type of flexible, free-standing aerogel membrane can be easily coupled with conventional HEPA filter technology providing useful additional functionalities. This can be done by:
Integration of the free-standing membranes by adhesion (gluing)
Liquid phase impregnation (screen printing, dip coating) of HEPA filters with these materials
Impregnation by spray techniques The potential market segments are the indoor air-conditioning in buildings and vehicles (car, airplane industry) and the solar-thermal water purification systems.

Solar-Thermal Water and Air Purification Device

Figure 10:
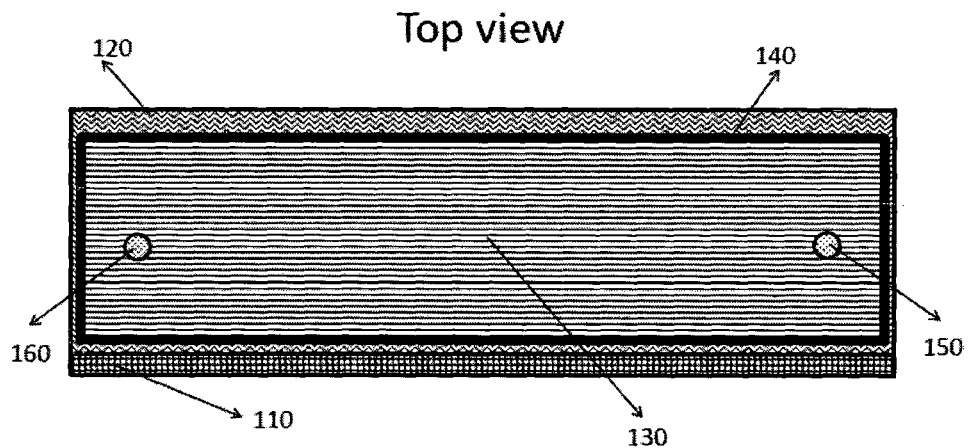
Figure 10:
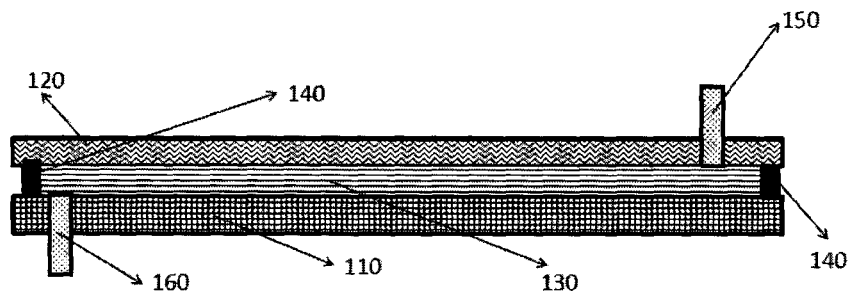

The Solar-thermal water and air purification system disclosed above is a low cost, durable and easy to operate device which allows producing drinking water from surface water resources at remote places where the construction of water distribution pipelines is not foreseen. Three essential functions are coupled in one device: mechanical filtration, oxidation power and pasteurization. The core element of the Solar-thermal water and air purification system is the photocatalytic titanium oxide based aerogel membrane described above (FIG. 4-7, FIG. 10(130)). One of the main advantages of the device lies in the simple device geometry. The membrane is placed in between two UV-VIS-IR transparent sheets (FIG. 10(110,120)) made from polymers, quartz, high purity glass or borosilicate glass. The two sheets have to be sealed (FIG. 10(140)) so as to have an entry and an exit hole (FIG. 10(150,160)). The flux of the liquid or gas can be controlled by pressure and/or tilting angle of the device. In principle the device does not require any electricity. In order to function it requires gravitational force (which is abundant) and a light source (natural or artificial). When the upper reservoir is filled with the contaminated water the gravitational and capillary forces will allow only the liquid and particles smaller than 10 nm to enter into the porous aerogel membrane (FIG. 10(130)). The organic compounds will slowly diffuse through the porous aerogel membrane. When exposed to light the photochemical reactions will kill or inactivate the hazardous biological or chemical compounds capable to enter into the porous scaffold. Inactivation can be anything e.g. oxidization, denaturation, pasteurization. The physico-chemical properties of the liquid or gas will be different before entering and after leaving the device (FIG. 10(150, 160)). Since the incoming photons heat up the black colored system the device with minor modifications could be used as a solar-thermal collector as well.

Further Applications of Titanium Oxide Composite Aerogels
1) Mesoscopic solar cells as dye sensitized solar cells and perovskite based meso-superstructured solar cells.
2) Transparent UV-blocking, self-cleaning and antireflective functional coatings (on windows, mirrors and solar cells and medical devices).
3) Multifunctional filler (functionalities: pigment, mechanical reinforcement, bioactivity, bio-inertness, self-cleaning ability, UV stability, improved chemical and heat stability, dielectric properties) in polymer composites: Thermosetting and thermoplastics and biopolymers.
4) Multifunctional filler (functionalities: pigment, mechanical reinforcement, bioactivity, bio-inertness, self-cleaning ability, dielectric properties) inorganic composites: ceramics, dielectrics, cement industry.
5) Multifunctional filler (functionalities: purple, blue, green, yellow, orange pigment due to the plasmonic color of the supported plasmonic nanoparticles (unconventional colored alloys of Au, Ag, Cu), mechanical reinforcement, bioactivity, bio-inertness, self-cleaning ability, dielectric properties) in metals: jewelry, watch industry.
6) Thermoelectric material to convert (waste) heat into electricity. The measured Seebeck coefficient of the rutile aerogel was as high as 700 µV/K.
7) Heat insulation material due to the extremely high porosity and low thermal conductivity of the aerogel.
8) Anode material in lithium ion batteries. Excellent Li intercalation properties.
9) Electrode material in supercapacitors. High surface area combined with the engineered porosity.

The invention claimed is:
1. An aerogel comprising at least 90% titanium oxide and having a porosity of at least 90%,
wherein crystallites of the titanium oxide are between 5 nm and 100 nm, and the crystallites assemble into elongated particles of several micrometers in length.
2. The aerogel according to claim 1 wherein the porosity is between 90% and 99.6%.

3. The aerogel according to claim 2 comprising 100% of titanium oxide.

4. The aerogel according to claim 1 having a specific surface area greater than 60 $m^2/g$, wherein the aerogel is obtained by turbulent mixing of a titanium compound.

5. The aerogel according to claim 4 wherein the turbulent mixing is achieved with an external mixer with a brush with 300-2500 rpm.

6. A mesoscopic solar cell including an aerogel as defined in claim 1.

7. A multifunctional filler including an aerogel as defined in claim 1.

8. A thermoelectric material including an aerogel as defined in claim 1.

9. A heat insulation material including an aerogel as defined in claim 1.

10. An anode material for lithium ion batteries including an aerogel as defined in claim 1.

11. A supercapacitor including an aerogel as defined in claim 1.

12. A self-cleaning filter including an aerogel as defined in claim 1.

13. The aerogel according to claim 1, wherein at least 10% of the aerogel has slit shaped mesopores.

14. The aerogel according to claim 1, wherein the aerogel includes at least 1% of carbon nanotubes, and wherein the carbon nanotubes and the titanium oxide form an interpenetrating structure.

15. A process for aerogel manufacturing comprising:
adding a titanium compound to a base solution having a concentration of 1-20 M,
turbulently mixing the titanium compound that is in the base solution,
thereby manufacturing an aerogel comprising at least 90% titanium oxide and having a porosity of at least 90%, wherein crystallites of the titanium oxide are between 5 nm and 100 nm, and the crystallites assemble into elongated particles of several micrometers in length.

16. The process according to claim 15 wherein the turbulent mixing is achieved with an external mixer with a brush with 300-2500 rpm.

17. A method for controlling the porosity of an aerogel, the method comprising:
providing an initial aerogel product having a specific porosity,
applying a pressure on the aerogel product in order to reduce a volume,
such that the aerogel product comprises at least 90% titanium oxide and has a porosity of at least 90%, and wherein crystallites of the titanium oxide are between 5 nm and 100 nm, and the crystallites assemble into elongated particles of several micrometers in length.

18. The method according to claim 17 further comprising:
applying the pressure with a surface structured tool to create micro- and nanosized features on the product.

* * * * *